United States Patent [19]

Chiong

[11] Patent Number: 4,904,564
[45] Date of Patent: Feb. 27, 1990

[54] PROCESS FOR IMAGING MULTI-LAYER RESIST STRUCTURE

[75] Inventor: Kaolin N. Chiong, Pleasantville, N.Y.

[73] Assignee: International Business Machines Corporation, Armonk, N.Y.

[21] Appl. No.: 207,574

[22] Filed: Jun. 16, 1988

[51] Int. Cl.[4] ............................................... G03C 5/18
[52] U.S. Cl. ............................... 430/156; 430/191; 430/312; 430/165
[58] Field of Search ................ 430/156, 191, 312, 165

[56] References Cited

U.S. PATENT DOCUMENTS

| | | |
|---|---|---|
| 3,661,582 | 5/1972 | Broyde . |
| 4,238,559 | 12/1980 | Feng et al. ........................... 430/156 |
| 4,564,584 | 1/1986 | Fredericks et al. .................. 430/156 |

FOREIGN PATENT DOCUMENTS

| | | | |
|---|---|---|---|
| 0211350 | 7/1986 | European Pat. Off. ............ | 430/191 |
| 0036648 | 4/1981 | Japan .................................. | 430/191 |

OTHER PUBLICATIONS

Novolac Resins Used in Positive Resist Systems, T. R. Pampalone, Solide State Technology, Jun. 1984, pp. 115–120.

Primary Examiner—Paul R. Michl
Assistant Examiner—Thoyl Chil
Attorney, Agent, or Firm—Pollock, Vande Sande & Priddy

[57] ABSTRACT

An image is provided by depositing a first layer of a photoresist containing a phenolic-formaldehyde novolak type polymer and an imidazole, benzimidazole, triazole, or indazoles to increase the solubility of the layer in aqueous alkaline developer after exposure to imaging radiation; depositing on the first layer a second layer of a photoresist containing a phenolic-formaldehyde novolak type polymer; the second layer having a lower degree of solubility in aqueous alkaline developer after exposure to imaging radiation; exposing the layers to imaging radiation; and developing the layers.

12 Claims, No Drawings

PROCESS FOR IMAGING MULTI-LAYER RESIST STRUCTURE

TECHNICAL FIELD

The present invention is concerned with providing an image, and is particularly concerned with providing an image or mask of a multi-layer resist article. The present invention is especially concerned with providing what is referred to as photosensitive conformable masks whereby only one exposure step and one development step are required. According to the present invention, the bottom layer is modified so that a desired profile of the patterned resist is readily obtained.

BACKGROUND ART

In the manufacture of patterned devices such as semiconductor chips and carriers, the steps of defining different layers which constitute the desired product are among the most critical and crucial steps involved. Polymer films are often used in integrated circuit fabrication as a pattern transfer mask for the semiconductor substrates. For example, polymers used as a photoresist can act as a mask for etching, ion implantation, or lift-off to induce designated removal, doping, or addition to the underlying substrate, respectively.

As the lines and spaces to be etched, however, become smaller, such as at about 1 micron, the photolithographic procedures for producing the photoresist pattern that is the etch mask are affected by such parameters as reflections from the surface grain structure of the metals or polysilicon substrate to be etched, standing wave effects, variations in the photosensitive material thickness, reflections from steps and diffraction effects.

One technique for overcoming the problems of surface topology, reflections and diffractions, is to employ a multi-layer resist system known as a portable conformable mask (PCM) system. Such is described by Burn Jeng Lin, "Portable Conformable Mask —A Hybrid Near U.V. and Deep U.V. Patterning Technique", Proceeding of SPIE, Vol. 174, page 114, 1979, disclosure of which is incorporated herein by reference. The simplest multi-layer resist system employs a two-layer resist system which avoids the cost and complexity of most other multi-layer systems. The bottom layer is insensitive to the radiation used to image the top resist layer, and is preferably a resist from a polymer of methylmethacrylate such as polymethylmethacrylate (PMMA), that is applied over the wafer topology to provide a planar surface. The top layer is generally a relatively thin (e.g., about 1 micron or less) layer of a material that is simultaneously sensitive to the imaging radiation —electron beam, X-ray, or optical radiation —and opaque to the radiation used to expose the bottom layer. Typically this can be a positive photosensitive material that responds to the imaging radiation such as ultraviolet light used in step-and-repeat photolithography and is opaque to deep U.V. wavelengths used to expose PMMA. After the top layer is imaged and developed, the bottom layer is imaged by flood exposure through the top layer resist mask and developed using, for instance deep U.V. (about 190 nm to about 280 nm).

A number of the suggested processes used to overcome image distortion or linewidth variation due to different radiations from the irregular surfaces require processing that is rather complex. This causes a decrease in the throughput and an increase in process control problems.

It has also been suggested to use two layers of the same parent resist of varying molecular weights to achieve different sensitivities or solubilities. However, such an approach requires unique synthetic effort for control of molecular weight as well as tedious polymer characterizations. It would, therefore, be desirable to provide a method that is capable of overcoming image distortion or linewidth variations due to different radiations from irregular surfaces that does not require the complex processing now employed.

SUMMARY OF THE INVENTION

The present invention is concerned with a process for resist patterning to obtain the desired profile and overcome the distortion problems due to different reflective radiations from irregular surfaces without requiring special synthesis or polymer characterizations. Resist patterning pursuant to the present invention requires only one exposure and one developing step to obtain the desired imaged profile.

In particular, the process of the present invention includes depositing on a substrate a first layer of a positive photoresist that includes a phenolicformaldehyde novolak type polymer with a diazo sensitizer and a modifier in an amount to increase the solubility of the layer in aqueous alkaline developer after exposure to image radiation. The modifier is an imidazole, benzimidazole, triazole, or indazole. Mixtures can be employed if desired.

Deposited on the first layer is a second and different layer of a positive photoresist comprising a phenolicformaldehyde novolak type polymer with a diazo sensitizer.

The second layer has a lower degree of solubility than the first layer in aqueous alkaline developer after exposure to imaging radiations.

The first and second layers are exposed to imaging radiation in a predetermined pattern and developed.

Best and Various Modes for Carrying out the Invention

The first layer of the first resist material employed in accordance with the present invention is a positive resist material.

The positive resist is a phenolic-formaldehyde novolak type polymer sensitized with diazo compounds. Examples of such diazo sensitizers are discussed on pages 48–55 of DeForest, *Photoresist Materials and Processes*, McGraw-Hill Book Company, 1975, disclosure of which is incorporated herein by reference. Some diazo compounds are derivatives of benzoquinone 1, 2-diazide-4-sulphochloride; 2-diazo-1-napthol-5-sulphonic acid ester; napthoquinone-1, 2-diazide-5-sulphochloride; naptho-quinone-1, 2-diazide-4 sulphochloride; napthoquinone 2-1-diazide-4-sulphochloride and napthoquinone 2, 1-diazide-5-sulphochloride. The preferred diazo sensitizers are the diazo-naphthoquinone sensitizers.

The phenolic component of the phenolic novolak polymer includes phenol and substituted phenols such as cresol. A particular example of such is Shipley AZ-1350 which is an cresol-formaldehyde novolak polymer composition. Such a positive resist composition includes therein a diazoketone such as 2-diazo-1-napthol-sulphonic ester.

The composition usually contains on the order of about 15% by weight or so of the diazoketone compound. Examples of some other commercially available photosensitive materials suitable for providing the first layer of material employed in accordance with the present invention are AZ-1370 and AZ-1470 from Shipley; AZ-4110 and AZ-4210 from AZ Photoresistive Division of American Hoechst; HPR 204 from Phillip A. Hunt; Kodak 820 from Kodak, and OFPR 800 from Tokyo Ohka.

The first layer according to the present invention must also contain an imidazole, triazole, indazoles, tetrazoles, or mixtures thereof. The preferred compounds are the imidazoles with the most preferred being benzimidazole.

Examples of some additional compounds of the above types are imidazole, 1-methyl-imidazole, 1-propyl-imidazole, 2, 4-di-methyl-imidazole, 4-methyl-imidazole, 2-isopropyl-imidazole, 2-phenyl-imidazole, 1-benzylimidazole, β-imidazolopropionic acid, 1, 2-dimethylimidazole, 1-methyl-2-hydroxymethyl-imidazole, 4-sulfo-imidazole, 2-methyl-4-sulfo-imidazole, 2-(sulfophenyl)-imidazole, 2-isopropyl-4-sulfo-imidazole, 1-n-propyl-5-sulfo-imidazole, 1-n-propyl-4-sulfoimidazole, 1, 2-bis-(1'-imidazolyl)-ethane, 1-(p-sulfophenyl)-imidazole, histidine, 2-(imidazolo-ethyl)-pyridine, 1-(2'-aminoethyl)-imidazole-hydrochloride, 1-(3'-aminopropyl)-imidazole-hydrochloride, 1-methyl-2-carboxy-methyl-imidazole, 2-(p-sulfophenyl)-4-sulfoimidazole, 1-methyl-2-sulfo-imidazole, 2-sulfoimidazole, 1, 2-bis-(1'-methyl-5'-imidazolyl)-ethane, 5-sulfobenzimidazole, 5, 7-disulfobenzimidazole, tetraxole, indaxole, triazol-(1, 2, 4), 4-ethyl-triazole-(1, 2, 4), 4-methyl-triazole-(1, 2, 4), 4-phenyl-triazole-(1, 2, 4), 3, 4, 5-trimethyl-triazole-(1, 2, 4), 4-(p-sulfophenyl)-triazole-(1, 2,4 ), 3-methyl-triazole-(1, 2, 4), 3-ethyl-triazole-(1, 2, 4), 3, 5-dimethyl-triazole-(1, 2, 4), 3-phenyl-triazole-(1, 2, 4), 1-methyl-triazole-(1, 2, 4), 1-ethyl-triazole-(1, 2, 4), 1-phenyl-triazole-(1, 2, 4), 3-sulfo-triazole-(1, 2, 4), 3-amino-triazole-(1, 2, 4), 3, 5-diamino-triazole-(1, 2, 4), 1, 2-bis(5'-sulfo-3'-triazolyl)-ethane, 1, 2-bis-(5'-amino-3'-triazolyl) ethane, 1, 2-bis-(3'-triazolyl)-ethane, 1, 2-bis-(4'-methyl-3'-triazolyl)-ethane, bis-(3-triazolyl)-methane, bis-(5-sulfo-3-triazolyl)-methane, bis-(5-amino-3-triazolyl)-methane, bis-(3-triazolyl)-methane, bis-(5-sulfo- 3- triazolyl), bis-(5-amine-3-triazolyl), 3, 3'-bistriazolyl, 1, 2-bis-(1'-triazolyl)-ethane, 3-(2'-aminoethyl)-triazole-(1, 2, 4), β-(1-triazolyl)-propionic acid, 1, 4-bis-(5'-sulfo-3'-triazolyl)-butane, 1, 4-bis-(5-amino-3'-triazolyl)-butane, 1-(3-sulfopropyl)-triazole-(1, 2, 4), 1, 2-bis-(4'-triazolyl)-ethane, 1-methyl-triazole-(1, 2, 3), 1-ethyl-triazole-(1, 2, 3), 2-ethyl-triazole-(1, 2, 3), 2-propyl-triazole-(1, 2, 3), 1-(2'-carboxyethyl)-triazole-(1, 2, 3), 5-sulfo-benzotriazole, 5, 7-disulfo-benzotriazole, benzotriazole, 4-methyl-triazole-(1, 2, 3), 4, 5-dimethyl-triazole-(1, 2, 3), 4-butyl-triazole-(1, 2, 3), 4-phenyl-triazole-(1, 2, 3), 1-(3'-aminopropyl)-triazole-,(1, 2, 3), 1-(2'-aminoethyl)-triazole-(1, 2, 3), and 1, 2-bis-(5'-triazole)-ethane.

These materials are employed in an amount sufficient to increase the solubility of the layer in aqueous alkaline developer after exposure to imaging radiation. These materials are usually present in amounts of about 0.5% to about 4% and preferably about 1% to about 1.5% by weight of the photoresist.

The first layer is usually about 3,000 to about 7,000 angstroms and preferably about 4,000 to about 5,000 angstroms.

This first layer is commonly referred to as the planarizing layer and generally is thicker than the second layer atop it.

Deposited on said first layer is a second and different positive photoresist layer which differs from the first layer. This second layer contains a phenolicformaldehyde type polymer and a diazo-sensitizer of the type discussed above for the first layer. The second layer must have a lower degree of solubility than the first layer in aqueous alkaline. The second layer is usually thinner than the first layer and usually about 3,000 to about 5,000 angstroms and preferably about 3,000 to about 4,000 angstroms.

The structure is exposed to imaging radiation and developed. The resist image is typically produced by imaging radiation having a wavelength of about 365 to about 436 nanometers. The exposure is usually from about 60 to about 100 millijoules/cm$^2$ and preferably from about 80 to about 90 millijoules/cm$^2$.

The exposure to the radiation can be achieved by employing an ultraviolet lamp source.

In addition, if desired, electron beam radiation can be employed as the radiation source. In such a case, the dose of the electron beam imaging radiation is usually at least about 10 microcoulomb/cm$^2$ and preferably about 15 microcoulomb/cm$^2$.

The exposed portions are removed with an aqueous alkaline solution such as a potassium hydroxide or sodium hydroxide aqueous solution containing about 0.2N% to about 0.28N% of the hydroxide, preferably potassium hydroxide.

The following examples are presented to further illustrate the present invention.

EXAMPLE 1

Onto a planar silicon substrate is deposited a first layer of about 5,000 angstroms of a novolak resist containing about 17–20% diazonaphthoquinone and about 1.5% benzimidazole and a second and top layer of about 3,000 angstroms of the same novolak resist containing about 17–20% diazonaphthoquinone as in the bottom layer, but containing about 0.75% tetrazole. The structure is exposed to electrons at 25 microcoulombs/cm$^2$ at 25 KeV. the exposed films are developed in 0.25N KOH developer and 0.5 micron features are resolved with a controlled undercut profile for subsequent lift-off.

EXAMPLE 2

Example 1 is repeated, except the substrate employed is a silicon substrate with 0.4 μm silicon dioxide steps. The submicron features are delineated with no evidence of linewidth distortion.

Having thus described our invention, what we claim as new and desire to secure by Letters Patent is:

1. A process for providing an image which comprises:
depositing on a substrate a first layer of a positive photoresist comprising a phenolicformaldehyde novolak type polymer with a diazosensitizer and a compound selected from the group of imidazoles, benzimidzoles, triazoles, and indazoles, and mixtures thereof in an amount sufficient to increase the solubility of the layer in aqueous alkaline developer after exposure to imaging radiation;
depositing on said first layer a second and different layer of a positive photoresist comprising a phenolic-formaldehyde novolak type polymer with a diazo-sensitizer wherein said second layer has a lower degree of solubility than said first layer in aqueous alkaline developer after exposure to imaging radiation;

exposing said first layer of positive photoresist and said second layer of positive photoresist to imaging radiation in a predetermined pattern; and developing said first layer of positive photoresist and said second layer of positive photoresist to thereby remove the portions of said first layer and said second layer that were exposed to said imaging radiation.

2. The process of claim 1 wherein said compound is an imidazole.

3. The process of claim 2 wherein said imidazole is employed in amounts of about 0.5% to about 5% based upon the phenolic-formaldehyde novolak type polymer.

4. The process of claim 1 wherein said first layer is thicker than said second layer.

5. The process of claim 1 wherein said sensitizer is a diazo-naphthoquinone.

6. The process of claim 1 wherein said first layer is about 4,000 to about 7,000 angstroms, and said second layer is about 3,000 to about 5,000 angstroms.

7. The process of claim 1 wherein said first layer and said second layer are developed with an aqueous alkaline solution.

8. The process of claim 7 wherein said alkaline solution is a potassium hydroxide or sodium hydroxide aqueous solution 9. The process of claim 8 wherein said solution contains about 0.2N to about 0.28N of the hydroxide.

10. The process of claim 1 wherein said compound is benzimidazole.

11. The process of claim 1 wherein the phenolic-formaldehyde novalak type polymer and diazo-sensitizer employed in the second layer are the same as employed in the first layer and the relative amount of sensitizer to polymer in the second layer is the same as in the first layer.

12. The process of claim 1 wherein said predetermined pattern includes submicron features.

* * * * *